(12) United States Patent
Wu

(10) Patent No.: US 7,795,891 B2
(45) Date of Patent: Sep. 14, 2010

(54) TESTER WITH LOW SIGNAL ATTENUATION

(75) Inventor: Chia-Wei Wu, Taipei County (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 12/534,868

(22) Filed: Aug. 4, 2009

(65) Prior Publication Data

US 2009/0289649 A1  Nov. 26, 2009

Related U.S. Application Data

(62) Division of application No. 11/745,463, filed on May 8, 2007.

(30) Foreign Application Priority Data

Mar. 28, 2007 (TW) .............................. 96110718 A

(51) Int. Cl.
*G01R 31/02* (2006.01)
(52) U.S. Cl. .................................................. 324/754
(58) Field of Classification Search ................ 324/754, 324/765, 761–762, 72.5; 438/14–18; 257/48
See application file for complete search history.

(56) References Cited

U.S. PATENT DOCUMENTS 4,034,293 A * 7/1977 Roch .......................... 324/762

4,599,559 A * 7/1986 Evans ......................... 324/754

FOREIGN PATENT DOCUMENTS

TW  200305021  10/2003
TW  M254599   1/2005

OTHER PUBLICATIONS

"Office Action of Taiwan counterpart application", issued on Dec. 7, 2009, p1-p5.

* cited by examiner

*Primary Examiner*—Ha Tran T Nguyen
*Assistant Examiner*—Tung X Nguyen
(74) *Attorney, Agent, or Firm*—Jianq Chyun IP Office

(57) ABSTRACT

A tester with low signal attenuation and suitable for measuring an electrical characteristic of a subject to be tested includes a circuit board and a first probe. The circuit board has a first surface and a second surface respectively having a first signal transmission line and a second signal transmission line. The first probe has a contact end contacting the subject to be tested and a first signal end and a second signal end respectively connecting the first signal transmission line and the second signal transmission line. The first probe receives a testing signal from the first signal transmission line through the first signal end and transmits the testing signal from the contact end to the subject to be tested, such that the subject to be tested generates a response signal, and the first probe transmits the response signal to the second signal transmission line through the second signal end.

6 Claims, 6 Drawing Sheets

TESTER WITH LOW SIGNAL ATTENUATION

CROSS-REFERENCE TO RELATED APPLICATION

This application is a divisional application of and claims the priority benefit of co-pending U.S. application Ser. No. 11/745,463, filed on May 8, 2007, which claims the priority benefit of Taiwan application serial no. 96110718, filed on Mar. 28, 2007. The entirety of each of the above-mentioned patent applications is hereby incorporated by reference herein and made a part of this specification.

BACKGROUND OF THE INVENTION

1. Field of the Invention

The present invention relates to a probe structure. More particularly, the present invention relates to a split-type probe.

2. Description of Related Art

A semiconductor package test can be mainly divided into two parts, namely, wafer probe and sort after wafer processing, and final test after packaging. In the wafer probe and sort, a probe of a wafer probe card on a wafer probe is used to connect to a pad of each of dies on a wafer under test. Then, data measured is transmitted to a tester for analysis and determination to obtain repairable data of each die. According to the repairable data, a laser-repair device can be implemented to replace defected elements, and the entire wafer probe and sort can be done after the test is passed.

FIG. 1 is a structural view of a conventional wafer probe card. Referring to FIG. 1, a conventional wafer probe card 100 includes probes 102, 114, 116, and a circuit board 104. According to a current technique, the circuit board 104 usually adopts a fly-by structure, that is, signal transmission lines 106, 108 connected to each other by a connecting plug 110 are respectively disposed on two surfaces of the circuit board 104.

In the conventional art, one end of the probe 102 is connected to the connecting plug 110, and another end is used to contact with dies of a wafer under test (not shown). In addition, one end of the probe 114 and one end of the probe 116 are grounded or connected to a common voltage through connecting plugs 122 and 124, and another end of the probe 114 and another end of the probe 116 are used to contact with the subject to be tested.

In the conventional wafer probe card 100, the test end generates a testing signal to the signal transmission line 106 of the circuit board 104, and transmits the testing signal to the wafer under test through the probe 102, such that the subject to be tested generates a response signal. In addition, the probe 102 can receive the response signal generated by the subject to be tested, and transmits the response signal to the test end through the signal transmission line 108, so as to obtain the electrical characteristic of the subject to be tested.

FIG. 2A is a waveform diagram of the voltage vs. the time of the testing signal during transmission according to the conventional art. Referring to FIG. 2A, the longitudinal axis is the voltage, and the horizontal axis is the time. In addition, the waveform 201 is the waveform of the testing signal measured at the circuit board end, and the waveform 203 is the waveform of the testing signal measured at the contact end of the probe. As shown in FIG. 2A, when the circuit board transmits a testing signal to the subject to be tested through the probe, the signal attenuation amount is limited.

FIG. 2B is a waveform diagram of the voltage vs. the time of the response signal during transmission according to the conventional art. Referring to FIG. 2B, similarly, the longitudinal axis is the voltage, and the horizontal axis is the time. In addition, the waveform 211 is the waveform of the response signal measured at the contact end of the probe, and the waveform 213 is the waveform of the response signal measured at the circuit board end. As shown in FIG. 2B, the maximum voltage of the response signal at the contact end, e.g. A point, is approximately 750 mV. When the response signal is transmitted back to the circuit board by the probe, the maximum voltage, e.g. B point, is approximately 500 mV. High signal attenuation results in the error of the test end during a decision making process, and the signal attenuation is distinct during high-speed signal transmission. The subject to be tested can be a semiconductor device or each die on the wafer.

SUMMARY OF THE INVENTION

Accordingly, an exemplary embodiment provides a split-type probe for a tester, so as to reduce the attenuation of a signal resulted during transmission.

In addition, an exemplary embodiment also provides a tester with low signal attenuation, capable of accurately measuring the electrical characteristic of the subject to be tested.

The split-type probe is provided by the exemplary embodiment for contacting with a subject to be tested, so as to detect the electrical characteristic. The probe has a contact head used to contact with the subject, a first needle body and a second needle body. In the exemplary embodiment, the first needle body and the contact head are connected with each other, so as to transmit a testing signal to the subject for performing detection. In addition, the second needle body is also connected to the contact head, for transmitting a response signal generated by the subject due to the testing signal.

From another aspect, the exemplary embodiment provides a split-type probe, characterized in that the probe has a contact end, a first signal end, and a second signal end. In the embodiment, the probe receives a testing signal from the first signal end, and transmits the testing signal from the contact end to a subject to be tested, resulting in that the subject generates a response signal. In addition, the probe uses the contact head to receive the response signal, and transmits back the response signal from the second signal end, so as to detect the electrical characteristic of the subject to be tested.

From another aspect, the exemplary embodiment provides a tester with low signal attenuation, for measuring the electrical characteristic of a subject to be tested. The tester of the exemplary embodiment includes a circuit board having a first surface and a second surface. A first signal transmission line and a second signal transmission line are respectively disposed on the first surface and the second surface. In addition, the exemplary embodiment also has a probe having a contact end for contacting with the subject to be tested, and a first signal end and a second signal end respectively connected to the first signal transmission line and the second signal transmission line. In the embodiment, the probe receives a testing signal from the first signal transmission line through the first signal end, and transmits the testing signal to the subject to be tested through the contact end to allow the subject to generate a response signal. In addition, the probe receives the response signal through the contact end, and transmits the response signal to the second signal transmission line through the second signal end, so as to measure the electrical characteristic of the subject to be tested.

In the exemplary embodiment, the testing signal and the response signal are transmitted on different needle bodies, so the probe provided by the exemplary embodiment has a lower signal attenuation, such that the detecting apparatus provided by the exemplary embodiment can accurately measure the electrical characteristic of the subject under test.

In order to make the aforementioned and other features and advantages of the present invention comprehensible, embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
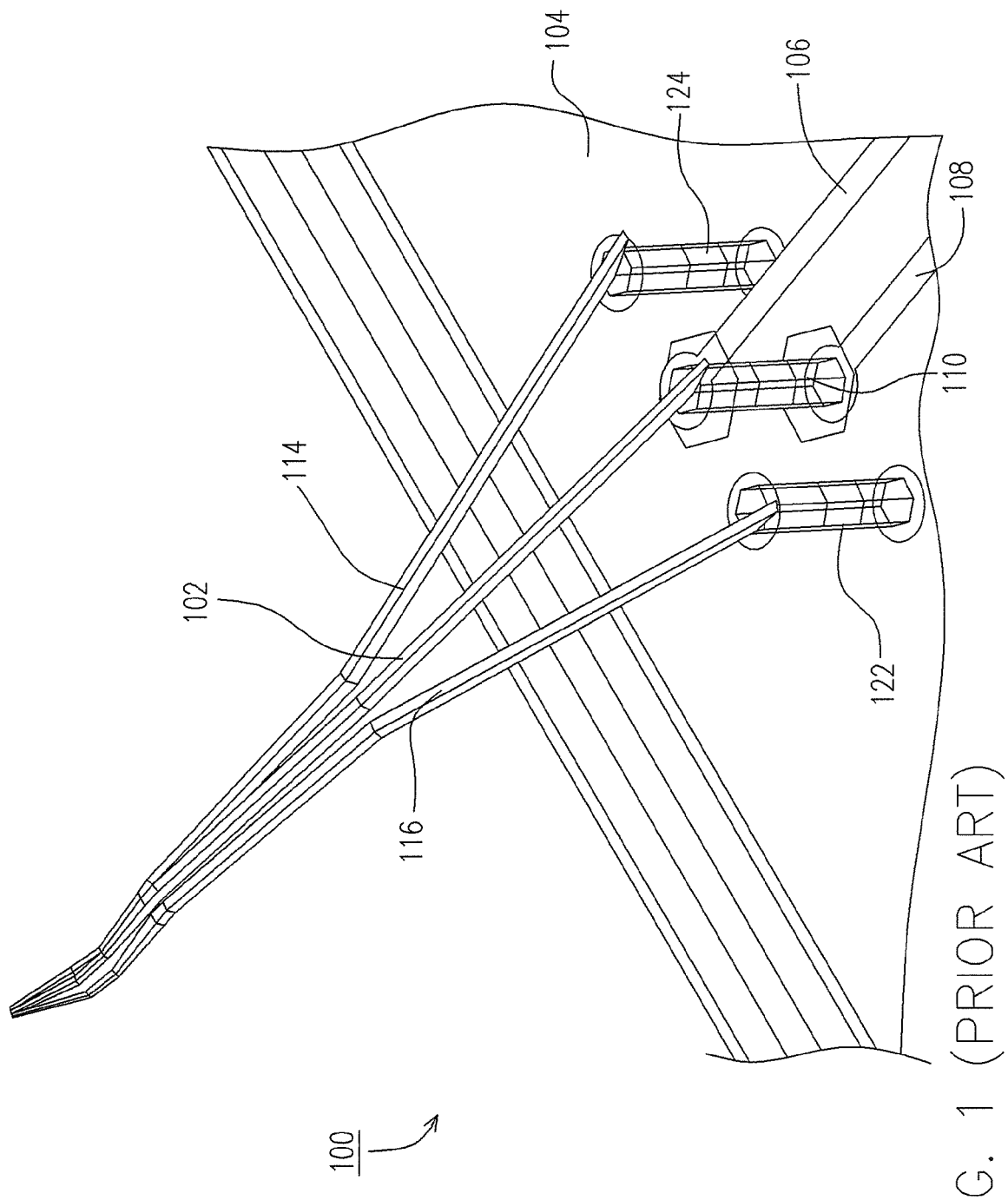
FIG. 1 is a structural view of a conventional wafer probe card.
Figure 2A:
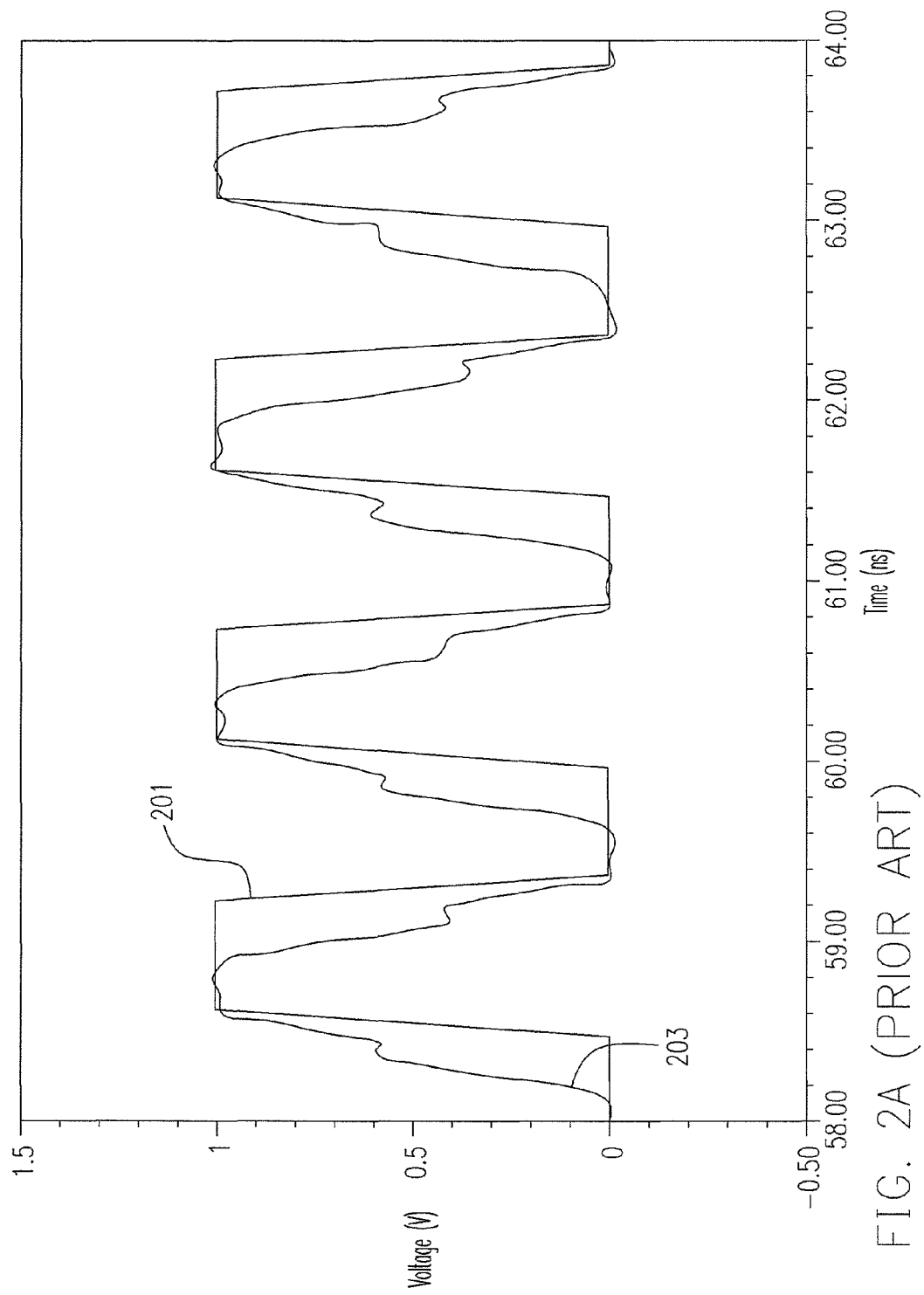
FIG. 2A is a waveform diagram of the voltage vs. the time of the testing signal during transmission according to the conventional art.
Figure 2B:
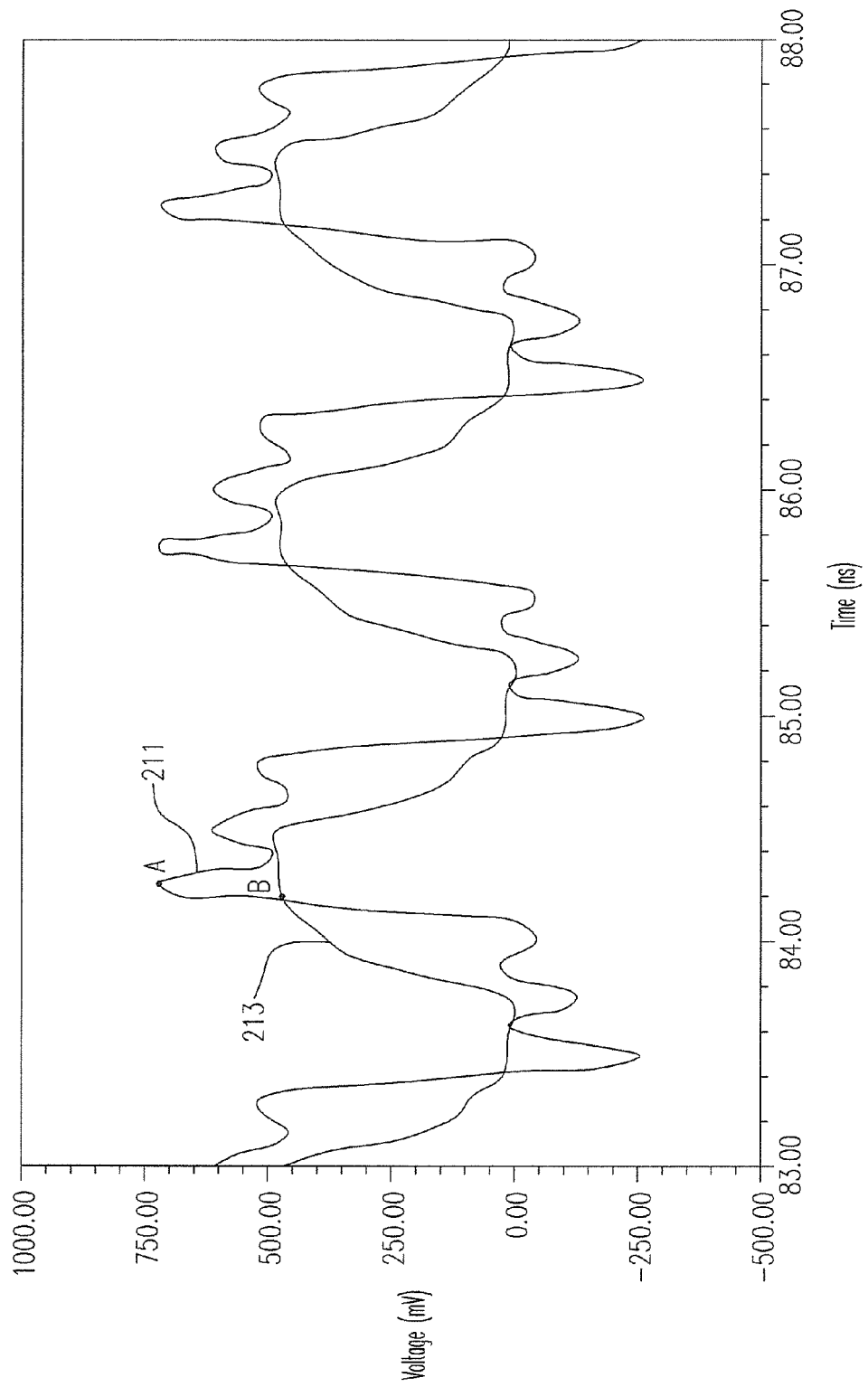
FIG. 2B is a waveform diagram of the voltage vs. the time of the response signal during transmission according to the conventional art.
Figure 3A:
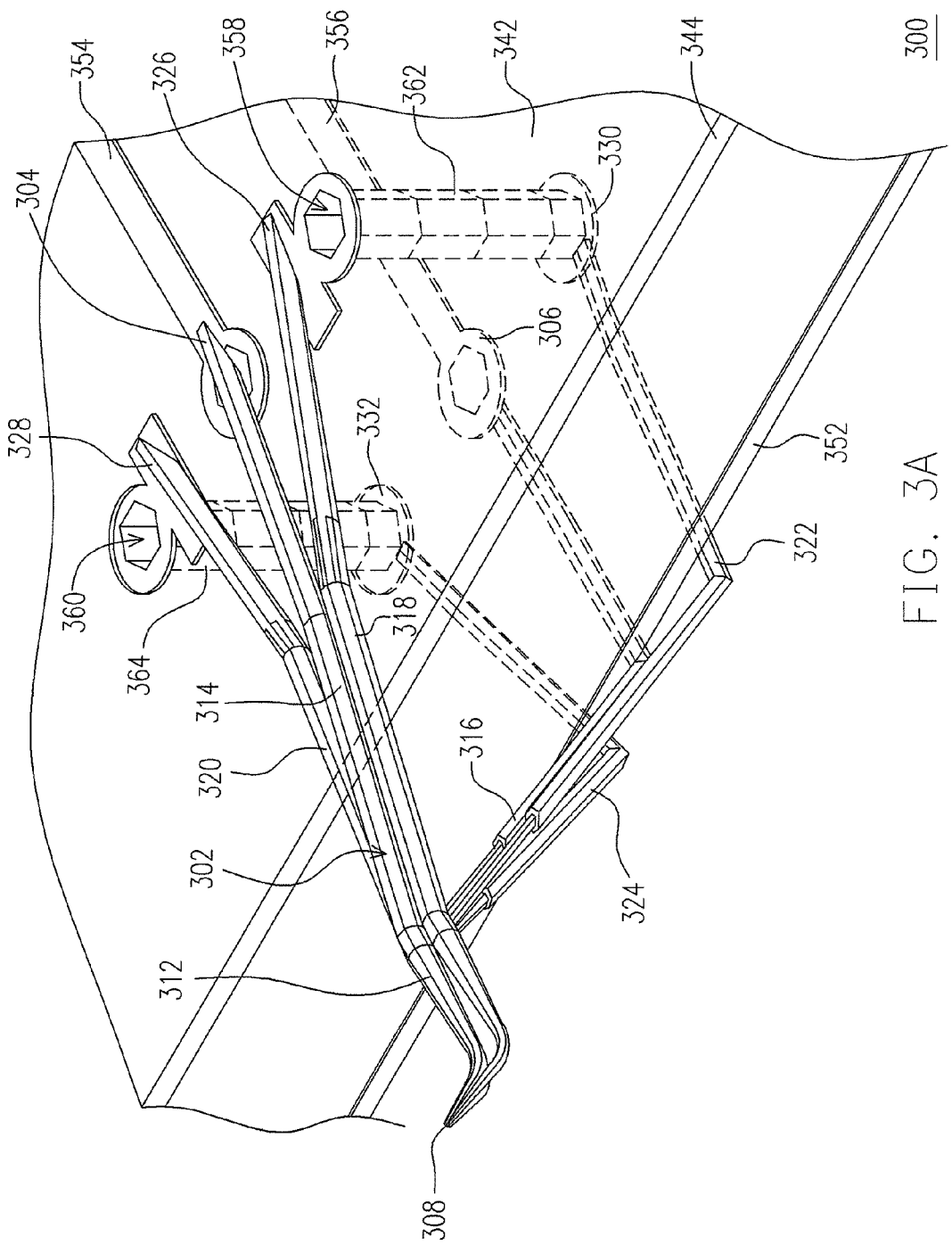
FIG. 3A is a perspective structural view of a tester according to an embodiment of the present invention.
Figure 3B:
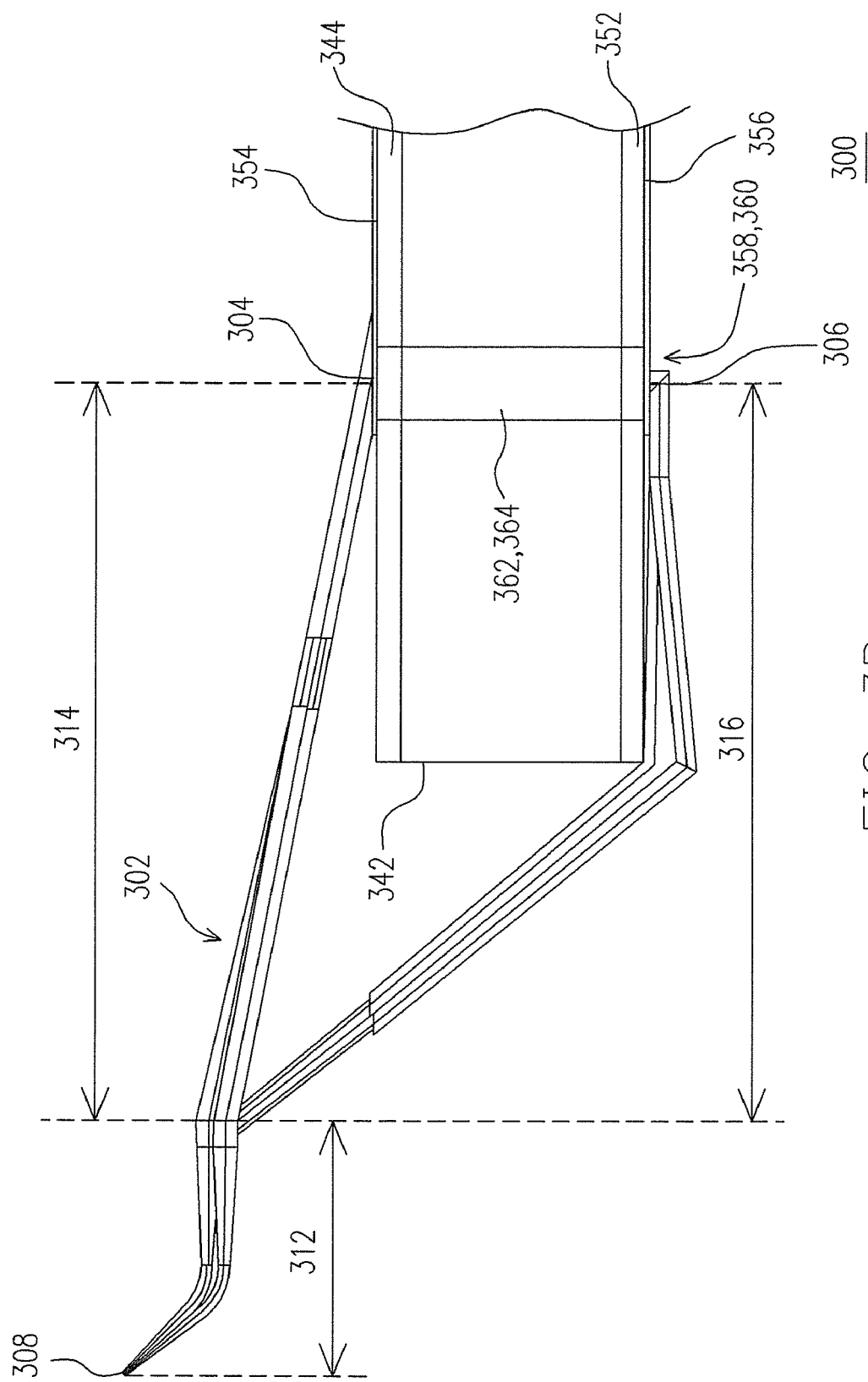
FIG. 3B is a side view of a tester according to an embodiment of the present invention.

FIG. 3A is perspective structural view of a tester according to an embodiment of the present invention, and FIG. 3B is a side view of a tester according to an embodiment of the present invention. Referring to FIGS. 3A and 3B, the tester 300 provided by the present invention includes a probe 302 and a circuit board 342. Particularly, the probe 302 provided by the present invention has a first signal end 304, a second signal end 306, and a contact end 308. In this embodiment, the first signal end 304 and the second signal end 306 are respectively connected to the circuit board 342, and the contact end 308 of the probe 302 is used to contact with the subject to be tested, such as the semiconductor device or a plurality of dies on the wafer.

Generally speaking, the material of the probe 302 can be tungsten steel, BeCu, or palladium alloy. In this embodiment, the probe 302 at least has a contact head 312, a first needle body 314, and a second needle body 316. One end of the contact head 312 is used as the contact end 308, and another end is connected to the first needle body 314 and the second needle body 316. In addition, one of ends of the first needle body 314 and one end of the second needle body 316 are connected to one end of the contact head 312 together, and another one of ends of the first needle body 314 and another end of the second needle body 316 are respectively the first signal end 304 and the second signal end 306.

Generally speaking, the tester 300 provided by the present invention also includes probes 318 and 320 respectively disposed at two sides of the probe 302. In this embodiment, one end of the probe 318 and one end of the probe 320 are used to contact with the subject to be tested, and another end of the probe 318 and another end of the probe 320 are respectively a third signal end 326 and a fourth signal end 328, for electrically connecting to a common voltage or grounding.

In consideration of structural stress balance, in some selected embodiments, the tester 300 of the present invention also includes a probe 322 and a probe 324 which are located at two sides of the second needle body 316. One end of the probe 322 and one end of the probe 324 are respectively connected to probes 318 and 320 to contact with the subject to be tested, and another end of the probe 322 and another end of the probe 324 are respectively a fifth signal end 330 and a sixth signal end 332 for electrically connecting to a common voltage together or grounding with the third signal end 326 and the fourth signal end 328.

Referring to FIGS. 3A and 3B, the circuit board 342 also includes a first surface 344 and a second surface 352. In addition, the circuit board 342 in this embodiment can also have a plurality of through holes, for example through holes 358 and 360 exposed at the first surface 344 and the second surface 352. In addition, connecting plugs 362 and 364 are respectively disposed in the through holes 358 and 360. Whereby, the third signal end 326, the fourth signal end 328, the fifth signal end 330, and the sixth signal end 332 can be respectively connected to a common voltage or grounded through the connecting plugs 362 and 364.

In this embodiment, the circuit board 342 can be a fly-by structure. That is, a first signal transmission line 354 and a second signal transmission line 356 are respectively disposed on the first surface 344 and the second surface 352, and are respectively connected to the first signal end 304 and the second signal end 306 of the probe 302. Generally speaking, the first signal transmission line 354 and the second transmission line 356 can be copper foil line.

When the tester is used to measure the electrical characteristic of an subject to be tested (not shown), the contact end 308 of the probe 302 contacts with the subject to be tested, so as to generate a testing signal which is transmitted to the probe 302 through the first signal transmission line 354. At this time, the probe 302 receives the testing signal from the second signal end 306, and transmits the testing signal from the contact end 308 to the subject to be tested through the first needle body 314 and the contact head 312.

When the subject to be tested such as the wafer receives the testing signal, a response signal is generated. At this time, the probe 302 receives the response signal from the contact end 308, and transmits the response signal from the second signal end 306 to the second signal transmission line 356 of the second surface 352 of the circuit board 342 through the contact head 312 and the second needle body 316. Whereby, the test end can measure the electrical characteristic of the subject to be tested according to the response signal.

Figure 4:
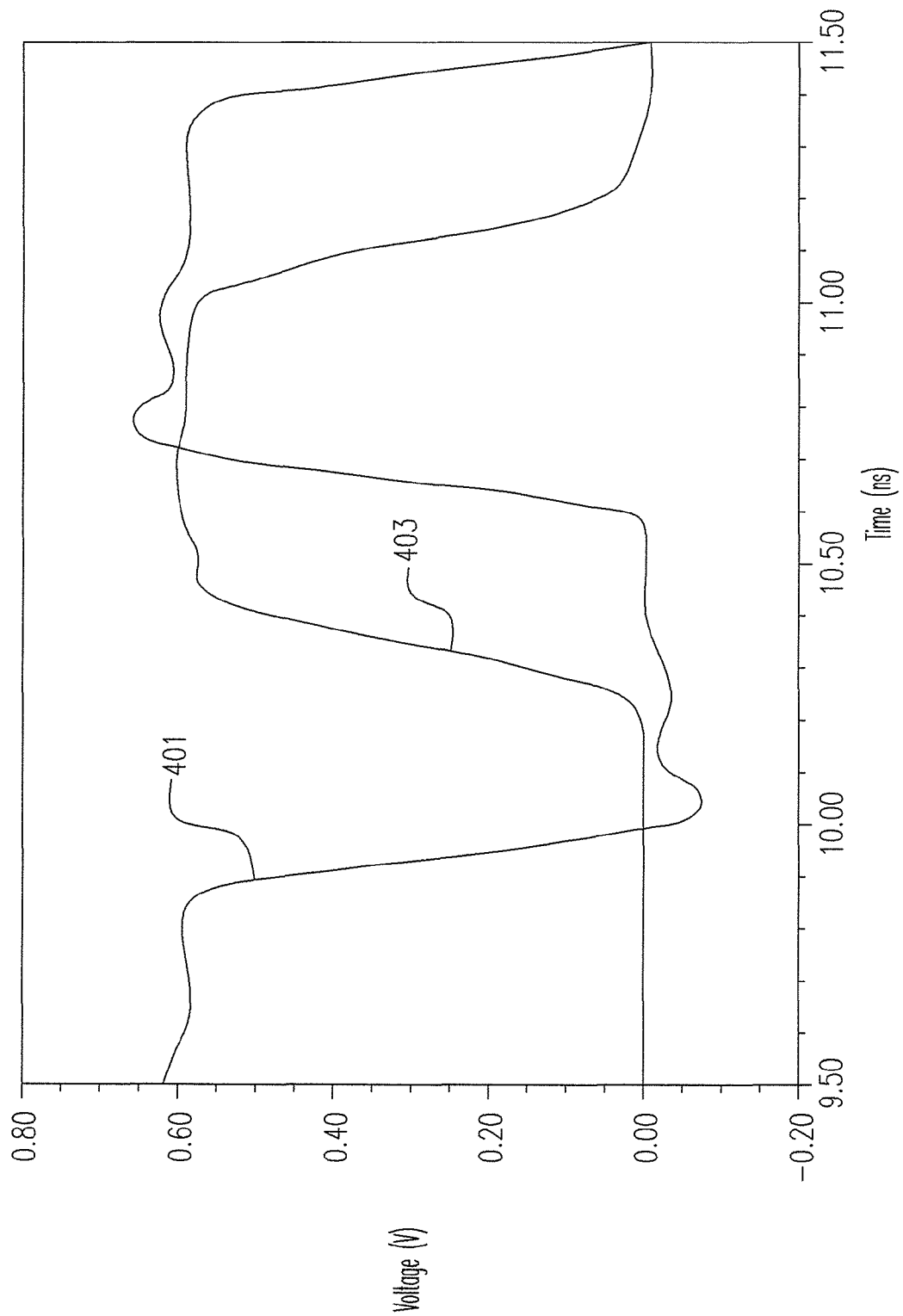
FIG. 4 is a waveform diagram of the voltage vs. the time measured when the response signal is transmitted through the split-type probe of the present invention.

FIG. 4 is a waveform diagram of the voltage vs. the time measured when the response signal is transmitted through the split-type probe of the present invention. The longitudinal axis is the voltage, and the horizontal axis is the time. In addition, the waveform 401 is the waveform of the response signal measured at the contact end of the probe, and the waveform 403 is the waveform of the response signal measured at the circuit board end. In the present invention, the transmission paths of the testing signal and the response signal in the probe are partially overlapped at the contact head, and most of the remaining transmission paths are split. Therefore, as shown in FIG. 4, the difference between the maximum value of the waveform of the response signal measured at the contact end and the maximum value of the waveform of the response signal measured at the circuit board end is merely about 50 mV. Therefore, the split-type probe provided by the present invention can be used to effectively overcome the problem of attenuation resulted during the transmission of the signal.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A tester with low signal attenuation, suitable for measuring an electrical characteristic of a subject to be tested, the tester comprising:
    a circuit board having a first surface and a second surface, wherein the first surface has a first signal transmission line, and the second surface has a second signal transmission line; and
    a first probe having a contact end for contacting with the subject to be tested, a first signal end connected to the first signal transmission line, and a second signal end connected to the second signal transmission line,
    wherein the first probe receives a testing signal from the first signal transmission line through the first signal end, and transmits the testing signal from the contact end to the subject to be tested, such that the subject to be tested generates a response signal, and the first probe transmits the response signal to the second signal transmission line through the second signal end for measuring electrical characteristic of the subject to be tested.

2. The tester with low signal attenuation as claimed in claim 1, further comprising:
    a second probe having one end used for contacting with the subject to be tested and another end electrically connected to the circuit board to connect to a common voltage; and
    a third probe having one end used for contacting with the subject to be tested and another end electrically connected to the circuit board to connect to the common voltage.

3. The tester with low signal attenuation as claimed in claim 2, wherein a common voltage potential is a ground potential.

4. The tester with low signal attenuation as claimed in claim 2, further comprising:
    a fourth probe having one end connected to the second probe and another end electrically connected to the circuit board to connect to the common voltage; and
    a fifth probe having one end connected to the third probe and another end electrically connected to the circuit board to connect to the common voltage.

5. The tester with low signal attenuation as claimed in claim 4, wherein the material of the first probe, the second probe, the third probe, the fourth probe, and the fifth probe comprises tungsten steel, BeCu, or palladium alloy.

6. The tester with low signal attenuation as claimed in claim 1, wherein the material of the first probe comprises BeCu or palladium alloy.

* * * * *